(12) United States Patent  
Nagai

(10) Patent No.: US 8,022,449 B2
(45) Date of Patent: Sep. 20, 2011

(54) PHOTODIODE ARRAY, METHOD OF MANUFACTURING THE SAME, AND DETECTING DEVICE

(75) Inventor: Youichi Nagai, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 153 days.

(21) Appl. No.: 12/541,380

(22) Filed: Aug. 14, 2009

(65) Prior Publication Data

US 2010/0044677 A1   Feb. 25, 2010

(30) Foreign Application Priority Data

Aug. 25, 2008 (JP) ................... 2008-215856

(51) Int. Cl.
*H01L 31/068* (2006.01)
(52) U.S. Cl. .......... 257/290; 257/21; 257/291; 257/292; 257/E33.076; 257/E33.077; 257/E31.096; 257/E27.133; 257/E25.032
(58) Field of Classification Search .................. None
See application file for complete search history.

(56) References Cited

U.S. PATENT DOCUMENTS

2008/0111142 A1* 5/2008 Furushima et al. ............ 257/91

OTHER PUBLICATIONS

Cohen et al., "A Thin Film Indium Gallium Arsenide Focal Plane Array for Visible and Near Infrared Hyperspectral Imaging", IEEE, pp. 744-745 (1999).

* cited by examiner

*Primary Examiner* — Minh-Loan T Tran
*Assistant Examiner* — Fei Fei Yeung Lopez
(74) *Attorney, Agent, or Firm* — Fish & Richardson P.C.

(57) ABSTRACT

A photodiode array includes a p-side electrode provided on each p-type region formed by selective diffusion and an n-side electrode connected to a non-growth part of an InP substrate and extends to the top surface side of an epitaxial multilayer. A wall surface of an edge at the non-growth part side of the epitaxial multilayer is a smooth surface. A lattice defect density in a portion of the edge of the epitaxial multilayer is higher than a lattice defect density in the inside of the epitaxial multilayer. Furthermore, the non-growth part of the InP substrate to which the n-side electrode is connected has a flat surface continuous from the inside of the InP substrate.

7 Claims, 9 Drawing Sheets ( Known method )

( Steps surrounded by double-line frame are steps that are not included in the present invention )

PHOTODIODE ARRAY, METHOD OF MANUFACTURING THE SAME, AND DETECTING DEVICE

BACKGROUND OF THE INVENTION

1. Field of the Invention

The present invention relates to a photodiode array, a method of manufacturing the same, and a detecting device. More specifically, the present invention relates to a photodiode array having responsivity in the near infrared, a method of manufacturing the same, and a detecting device, such as an image pickup device or a sensor, including the photodiode array.

2. Description of the Related Art

A photodiode array including an absorption layer composed of InGaAs having responsivity in the near infrared is used in imaging using space light, a sensor for a biologically relevant substance etc. Accordingly, many research and development have been carried out. In such a photodiode array including an absorption layer composed of InGaAs, an electrode (p-side electrode) of each photodiode (pixel) has the following structure. The p-side electrode of each photodiode is connected to a p-type region where Zn (p-type impurity) that has been selectively diffused from the top surface of an epitaxial multilayer is distributed, and further connected to a read wiring of a complementary metal-oxide semiconductor (CMOS) (M. J. Cohen, M. J. Lange, M. H. Ettenberg, P. Dixon, and G. H. Olsen, "A Thin-Film Indium Gallium Arsenide Focal Plane Array for Visible and Near Infrared Hyperspectral Imaging" 1999, IEEE, pp. 744-745). An electrode (n-side electrode) that provides each photodiode with a common ground potential is connected to an InP substrate or buffer layer containing an n-type impurity in a high concentration. The n-side electrode is connected to a ground terminal of the CMOS. Consequently, photogenerated charges generated by being detected by the photodiodes are read by the CMOS and form an image. In this structure, by separately forming p-type regions for respective photodiodes, a p-n junction or a p-i-n junction is independently formed in each photodiode. Accordingly, each of the photodiodes of the above photodiode array does not have a mesa-type structure, in which crystallinity tends to be decreased.

In the case where a p-type region is formed by selective diffusion of Zn, a surface of an $n^+$InP substrate or an $n^+$ buffer layer is exposed, and an n-side electrode is connected to the exposed surface. For this purpose, an edge of an epitaxial multilayer including an InGaAs absorption layer is etched (mesa-etched). The common n-side electrode is connected to a margin (i.e., non-growth part) which is a surface of the exposed $n^+$InP substrate or buffer layer. This n-side electrode is formed so as to extend along a wall of the edge of the mesa-etched epitaxial multilayer and to have the same height as the height of the p-side electrode at the top surface side of the epitaxial multilayer. The n-side electrode is connected to a predetermined terminal of a CMOS, the terminal being arranged in a planer shape. That is, in this photodiode array, each of the photodiodes does not have a mesa-type structure, but the photodiode array has a mesa-type structure.

In the above-described photodiode array including an absorption layer composed of InGaAs, the photodiodes are separately formed by introducing a p-type impurity from the top surface of an epitaxial multilayer, and thus each of the photodiodes does not have a mesa-type structure. However, when the photodiode array is viewed as one unit, the area of the photodiode array forms a mesa-type structure. When an edge of an epitaxial multilayer is mesa-etched, large irregularities due to a difference in the etching rate or the etching plane direction between materials are formed on a wall of the mesa-etched edge. A large number of man-hours are required in this first etching because etchants are changed in accordance with the types of material of each layer constituting the epitaxial multilayer. In order to remove such large irregularities, it is possible to add a correction to the wall of the edge of the epitaxial multilayer by performing additional etching. The additional etching also requires a large number of man-hours. In the case of mass production, performing the above-mentioned first etching and additional etching requires a very large number of man-hours, thereby increasing the manufacturing cost. On the other hand, when only the first etching is performed, and if an n-side electrode is formed on the wall of the edge of the epitaxial multilayer, the wall having large irregularities thereon, the irregularities inhibit, for example, a flow of a gas phase and a smooth deposition of a deposition material of the n-side electrode. As a result, a problem that the n-side electrode is not continuously formed (i.e., disconnection) occurs. It is sufficient that one n-side electrode is formed at any position of the photodiode array, but such irregularities are disposed around the periphery of the edge of the epitaxial multilayer. Accordingly, the problem of disconnection may occur regardless of the position at which the n-side electrode is formed.

SUMMARY OF THE INVENTION

According to the present invention, in a photodiode array including a Group III-V compound semiconductor, a second conductive-side electrode that is common to photodiodes and that extends to the top surface side of an epitaxial multilayer can be efficiently and reliably formed. It is an object of the present invention to provide such a photodiode array, a method of manufacturing the same, and a detecting device including the photodiode array.

A photodiode array of the present invention, includes a plurality of photodiodes that are arrayed in an epitaxial multilayer including an absorption layer composed of a Group III-V compound semiconductor, the epitaxial multilayer being grown on an InP substrate or a buffer layer disposed on the InP substrate. This photodiode array includes a first conductivity type region formed in each of the photodiodes by selective diffusion from the top surface side of the epitaxial multilayer, a first conductive-side electrode provided on the first conductivity type region, and a second conductive-side electrode provided for the plurality of photodiodes in common. In the photodiode array, the InP substrate or the buffer layer has a non-growth part on which the epitaxial multilayer is not grown, the non-growth part being disposed at the periphery of the photodiode array. The second conductive-side electrode is connected to the non-growth part of the InP substrate or the buffer layer and extends to the top surface side of the epitaxial multilayer. A wall surface of an edge portion of the epitaxial multilayer at the second conductive-side electrode side is a smooth surface. A lattice defect density in the edge portion of the epitaxial multilayer is higher than a lattice defect density in the inside of the epitaxial multilayer, and a surface of the non-growth part of the InP substrate or the buffer layer is a flat surface continuous from the side at which the epitaxial multilayer is disposed.

According to the configuration described above, the non-growth part of the InP substrate to which the second conductive-side electrode is connected has the following features: (1) The non-growth part is not formed by forming an epitaxial multilayer on the entire surface of an InP substrate (or the entire surface of a buffer layer formed on the entire surface of an InP substrate), and removing an edge portion of the epitaxial multilayer by etching or dicing. When an InP substrate (or a buffer layer) is exposed while etching a Group III-V epitaxial multilayer, the exposed surface of the InP substrate (or the buffer layer) does not become flat. The surface of the InP substrate has a concave shape after the etching. An etchant that etches an epitaxial multilayer including a Group III-V compound semiconductor also etches an InP substrate or a buffer layer provided on the InP substrate. (2) When an InP substrate (or a buffer layer) is exposed while mechanically removing an epitaxial multilayer by dicing, the exposed surface is inevitably a processed surface. Accordingly, if a non-growth part is formed by dicing, the surface of the non-growth part of the InP substrate is not a flat surface continuous from the side at which the epitaxial multilayer is disposed. In addition, a high lattice defect density in an edge portion of the epitaxial multilayer is not derived from cleavage or the like. (3) A cleavage surface has a specific river pattern, but the wall surface of the edge is a smooth surface as described above. Accordingly, it is believed that the epitaxial multilayer maintained the shape of the edge from the time of the formation of the epitaxial multilayer. That is, the epitaxial multilayer has been formed so that the non-growth part is present.

A distribution of lattice defect density represented by the phrase "a lattice defect density in an edge portion at the non-growth part side of the epitaxial multilayer is higher than a lattice defect density in the inside of the epitaxial multilayer" means the following state. That is, at the edge portion of the epitaxial multilayer, epitaxially grown films are not formed. Consequently, crystals in the edge portion of the epitaxial multilayer are disordered as compared with those in the inside of the epitaxial multilayer, and the lattice defect density in the edge portion is higher than that of the inside of the epitaxial multilayer. The following is understood on the basis of the above fact. That is, the epitaxial multilayer was formed in an opening of a mask pattern for selective growth (i.e., selective growth mask pattern). The reason for the understanding will be described below. The above-described state of the distribution of the lattice defect density is generated by the following mechanism. An opening of the selective growth mask pattern is surrounded by a mask portion. The epitaxial multilayer is grown only in the opening and is not grown on the mask portion. Selective growth of an epitaxial layer is performed by molecular beam epitaxy (MBE), organo-metallic vapor-phase epitaxy (OMVPE), or the like. During the selective growth, a wall surface of the mask portion, the wall surface facing the opening, allows to a molecular beam or a vapor-phase atom to adhere or prevents the molecular beam or the vapor-phase atom from adhering, resulting in a crystal disorder of an epitaxially grown layer located at the central side (inside) of the opening. Consequently, the epitaxial multilayer located in a predetermined range facing the wall of the opening has a lattice defect density higher than that in the inside portion of the epitaxial multilayer. The constituent feature that "a lattice defect density in an edge portion of the epitaxial multilayer is higher than a lattice defect density in the inside of the epitaxial multilayer" is a characteristic of an epitaxial multilayer that is formed using a selective growth mask pattern.

The range of the edge portion of the epitaxial multilayer having a high lattice defect density is a range where epitaxial growth is affected by the wall surface of the edge and is limited to a predetermined range. A photodiode formed at a position inside the range is formed as epitaxially grown films having a lattice defect density in a normal range and is not affected by the above-mentioned crystal disorder. Note that, for the sake of convenience, an expression "epitaxial multilayer having a high lattice defect density" is used, but, as a result of the high lattice defect density, the edge portion of the epitaxial multilayer may not be epitaxially grown in some cases.

According to the above configuration, the non-growth part is not formed by etching an epitaxial multilayer but ensured from the time of the deposition of epitaxial layers. The wall surface of an edge of the epitaxial multilayer is regulated by the wall of an opening, and becomes smooth (though the lattice defect density is high). Accordingly, etching need not be performed, and thus the second conductive-side electrode can be efficiently connected to the non-growth part and can extend to the top surface side along the edge of the epitaxial multilayer. More specifically, the second conductive-side electrode can be very efficiently and reliably formed in accordance with the shape of the second conductive-side electrode without causing disconnection or the like. Note that the term "top surface side of an epitaxial multilayer" refers to a side opposite an InP substrate. In addition, the term "inside of an InP substrate (or a buffer layer) refers to a part of the InP substrate (or buffer layer) overlapping the epitaxial multilayer. That may also be referred to as "a central side of the opening of the selective growth mask pattern.

As described above, a buffer layer may be provided so as to form a surface layer of an InP substrate. In such a case, the epitaxial multilayer may be located adjacent to a non-growth part of the buffer layer in plan view, and the second conductive-side electrode may be connected to the non-growth part of the buffer layer. Accordingly, a second conductivity-type impurity is incorporated in the buffer layer in a high concentration, and the second conductive-side electrode can be connected to the buffer layer. In this case, it is desirable that a configuration in which the transmittance of light is improved by using a Fe-doped semi-insulating InP substrate be adopted (as one of options). Note that the buffer layer may be formed as follows: (1) The buffer layer may be formed as a surface layer of the InP substrate as described above. (2) The buffer layer may be included in the epitaxial multilayer (i.e., may be formed in an opening of a selective growth mask pattern). (3) The buffer layer may not be used. In the case of (1) above, the buffer layer is formed so as to cover the entire surface of the InP substrate prior to the formation of the selective growth mask pattern. In the case of (1) above, the non-growth part of the buffer layer is formed. In the case of (2) above, after the formation of the selective growth mask pattern, the buffer layer is formed in the opening of the selective growth mask pattern. In the case of (2) above, the non-growth part of the buffer layer is not formed, and only the non-growth part of the InP substrate is present.

In the photodiode array according to an embodiment of the present invention, the second conductive-side electrode may fill a contact hole penetrating through an insulating layer disposed in contact with the wall surface of the edge of the epitaxial multilayer and functioning as a selective growth mask pattern, and extend to the top surface side of the epitaxial multilayer. Accordingly, the second conductive-side electrode can be formed by forming a through-hole reaching the InP substrate through the insulating layer and filling the through-hole. Consequently, an improvement of the manufacturing efficiency and an improvement of the yield can be realized.

In the photodiode array according to an embodiment of the present invention, the second conductive-side electrode may extend to the top surface side of the epitaxial multilayer so as to sandwich an insulating film or insulating layer between the wall surface of the edge of the epitaxial multilayer and the second conductive-side electrode. In this case, a part of the mask portion of the selective growth mask pattern may be left and used as the insulating film. Alternatively, the second conductive-side electrode may be provided so as to be in contact with a protective film constituting a structure of (the wall surface of the edge of the epitaxial multilayer/an impurity selective diffusion mask pattern/the protective film).

In the photodiode array according to an embodiment of the present invention, the absorption layer may have a multi-quantum well structure. In this case, an edge of the epitaxial multilayer including the absorption layer having the multi-quantum well structure has a smooth wall surface. Therefore, the second conductive-side electrode can be efficiently and reliably formed. In particular, the absorption layer may have a type II multi-quantum well structure of InGaAs/GaAsSb. In this case, a photodiode array having responsivity in a long-wavelength range of the near infrared can be obtained.

A detecting device of the present invention includes any one of the photodiode arrays described above and a complementary metal-oxide semiconductor (CMOS), wherein the first conductive-side electrode of the photodiode array is connected to a reading terminal of the CMOS, and the second conductive-side electrode of the photodiode array is connected to a ground terminal of the CMOS. Accordingly, the detecting device can be constituted by a highly reliable photodiode array that is manufactured with a high efficiency. Examples of the detective device include sensors and image pickup devices.

A method of manufacturing a photodiode array of the present invention includes the steps of (1) forming a selective growth mask pattern having an opening on an InP substrate or a buffer layer formed on the InP substrate; (2) forming an epitaxial multilayer only in the opening of the selective growth mask pattern while forming a non-growth part on which the epitaxial multilayer is not grown at a position corresponding to a mask portion of the selective growth mask pattern; (3) forming a selective diffusion mask pattern used for selectively diffusing a first conductivity-type impurity in each photodiode from the top surface side of the epitaxial multilayer; (4) forming a first conductivity type region by selectively diffusing the first conductivity-type impurity using the selective diffusion mask pattern, and then forming a first conductive-side electrode for each photodiode so as to be connected to the first conductivity type region; and (5) forming a second conductive-side electrode common to the photodiodes so as to be connected to the non-growth part of the InP substrate or the buffer layer.

According to the above method, the epitaxial multilayer is not formed in the mask portion of the selective growth mask pattern. The wall surface of an edge of the epitaxial multilayer is smooth. Accordingly, in forming the second conductive-side electrode, a problem such as disconnection does not occur. Consequently, the second conductive-side electrode can be very efficiently and reliably formed with high reliability.

In the method according to an embodiment of the present invention, the thickness of the selective growth mask pattern may be controlled to be the same as the thickness of the epitaxial multilayer, and the selective diffusion mask pattern may be formed on the selective growth mask pattern. In this case, selective diffusion can be performed in a state in which the selective growth mask pattern is left. Accordingly, a step of etching the selective growth mask pattern can be omitted.

In the method according to an embodiment of the present invention, the second conductive-side electrode may be formed using the mask portion of the selective growth mask pattern as an insulator to an edge portion of the epitaxial multilayer. In this case, the manufacturing efficiency of the photodiode array can be improved, and reliability of the photodiode array can be increased. In the case where the mask portion of the selective growth mask pattern is used as an insulator, the following embodiments may be included. (1) A contact hole is formed in the mask portion, and the second conductive-side electrode is then formed so as to fill the contact hole. (2) A part of the mask portion that is in contact with the epitaxial multilayer is left as an insulating film, and the second conductive-side electrode is then formed so as to be in contact with the insulating film. Alternatively, a selective diffusion mask pattern or a protective film may be formed between the second conductive-side electrode and the epitaxial multilayer. Other embodiments may be further included.

According to the present invention, in a photodiode array including a Group III-V compound semiconductor, a second conductive-side electrode that is common to photodiodes can be very efficiently and reliably formed on the top surface side of an epitaxial multilayer.

DESCRIPTION OF THE PREFERRED EMBODIMENTS

First Embodiment

Figure 1:
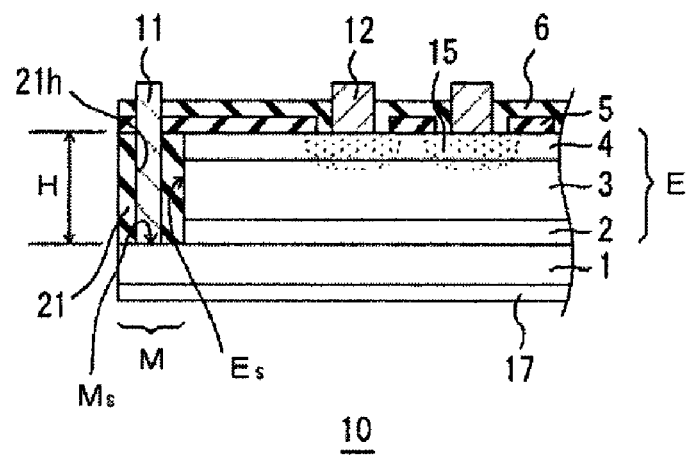
FIG. 1 is a view showing a photodiode array according to a first embodiment of the present invention.

FIG. 1 is a cross-sectional view of an edge portion of a photodiode array 10 according to a first embodiment of the present invention. An epitaxial multilayer E including an InP buffer layer 2, an absorption layer 3, and an InP window layer 4 is disposed on an n$^+$-type InP substrate 1 doped with sulfur (S). The absorption layer 3 may be composed of any Group III-V compound semiconductor. For example, $In_{0.53}Ga_{0.47}As$ may be used as the absorption layer 3. In the case of $In_{0.53}Ga_{0.47}As$, the photodiode array 10 has responsivity at a wavelength of 1.7 μm or less in the near infrared. Each photodiode includes a p-type region 15 formed by selectively diffusing zinc (Zn) through an opening of a mask pattern 5 for selective diffusion. In each photodiode, a p-n junction or a p-i-n junction is formed at an end of the p-type region 15.

A p-side electrode 12, which is a first conductive-side electrode, is provided for each photodiode in order to read photogenerated charges generated by being detected by the photodiode. The p-side electrode 12 is preferably composed of AuZn and formed so as to form ohmic contact with the p-type region 15 of the InP window layer 4. An n-side electrode 11, which is a second conductive-side electrode common to each of the photodiodes, is provided in a contact hole 21h penetrating through a protective film 6, the mask pattern 5 for selective diffusion (hereinafter also referred to as "selective diffusion mask 5") and a mask pattern 21 for selective growth (hereinafter also referred to as "selective growth mask 21"). The n-side electrode 11 is preferably composed of AuGeNi and formed so as to form ohmic contact with the InP substrate 1. This n-side electrode 11 fills the contact hole 21h and extends to the outside of the protective film 6 so that the height of the n-side electrode 11 is the same as the height of the p-side electrode 12. In addition, an anti-reflection (AR) film 17 is provided on the reverse face of the InP substrate 1, the reverse face functioning as a light-incident surface, to improve the responsivity.

Features of the photodiode array 10 according to the first embodiment of the present invention lie in the following points (P1) and (P2).

(P1) The n-side electrode 11 is formed in a non-growth part or margin M on the InP substrate 1 where the epitaxial multilayer E does not overlap. The non-growth part M is an area of the InP substrate 1 that has been occupied by the selective growth mask 21 before the epitaxial multilayer E is formed (see FIG. 3). The epitaxial multilayer E is formed in each opening A of the selective growth mask 21. Group III-V compound semiconductors are not grown on the selective growth mask 21. That is, the epitaxial multilayer E is not formed on the selective growth mask 21. The selective growth mask 21 is formed so that a thickness H of the selective growth mask 21 is equal to the thickness of the epitaxial multilayer E, and remains on the InP substrate 1 as is. Accordingly, a wall surface $E_s$ of an end of the epitaxial multilayer E extends along a wall surface of the opening A of the selective growth mask 21, and is formed as a smooth surface. A surface $M_s$ in the non-growth part M of the InP substrate 1 to which the n-side electrode 11 is connected is a surface of the InP substrate 1 and is a non-processed flat surface. These surfaces are obtained because etching of an edge portion of the epitaxial multilayer E is not performed in order to form the non-growth part M.

(P2) Epitaxially grown films are not formed at the edge portion of the epitaxial multilayer E, and crystals at the edge portion are disordered and have a high lattice defect density, as compared with the crystals located inside the epitaxial multilayer E. For example, polycrystals are formed at the above-mentioned edge portion and epitaxially grown films are formed inside the epitaxial multilayer. The disorder of the crystals is caused by an effect of a wall of the opening A of the selective growth mask 21 and shows that the selective growth mask 21 has been present before the formation of the epitaxial multilayer E. This shows that the epitaxial multilayer E of the photodiode array 10 is formed in the opening A of the selective growth mask 21.

In a known method, a non-growth part M is formed by removing an edge portion of an epitaxial multilayer E by etching. As etchants for etching Group III-V compound semiconductors, HCl-based etchants, $H_3PO_4$-based etchants, $H_2SO_4$-based etchants etc. are used. These etchants etch the InP substrate 1, which is composed of a Group III-V compound semiconductor. Therefore, as in the known method, when the epitaxial multilayer E is etched, the surface of the non-growth part M of the InP substrate 1 has a concave shape without exception. Furthermore, each of the above etchants has anisotropy with respect to a plane direction and preferentially etches in a predetermined plane direction. In addition, the etching rate varies depending on the crystals of each layer. The directions of the layers constituting the epitaxial multilayer E are different from each other. Therefore, when the edge portion of the epitaxial multilayer E is etched using the above etchants, the resulting wall surface of the edge becomes an irregular surface. Even if etching is performed so as to eliminate such irregularities, an etched surface having a direction specific to each layer appears on the edge of each epitaxial layer. As a result, edges of adjacent layers at a boundary therebetween form an angle, and thus the wall surface has an angular shape.

According to the photodiode array 10 shown in FIG. 1, although etching is performed when the contact hole 21h is formed through the selective growth mask 21, etching of the epitaxial multilayer E is not performed. As long as etching of Group III-V compound semiconductors, (1) the smooth wall surface $E_s$ of the epitaxial multilayer E and (2) the non-processed flat surface of the non-growth part M, the surface being continuous from the inside, are obtained. When the selective growth mask 21 is formed of an insulating material such as $SiO_2$, HF-based etchants can be used. HF-based etchants etch only $SiO_2$ without etching Group III-V compound semiconductors. In other words, HF-based etchants etch $SiO_2$ with a very high etching selectivity to left Group III-V compound semiconductors. Accordingly, the smooth wall surface $E_s$ of the epitaxial multilayer E and the non-processed flat surface of the non-growth part M, the surface being continuous from the inside, can be obtained.

Figure 2:
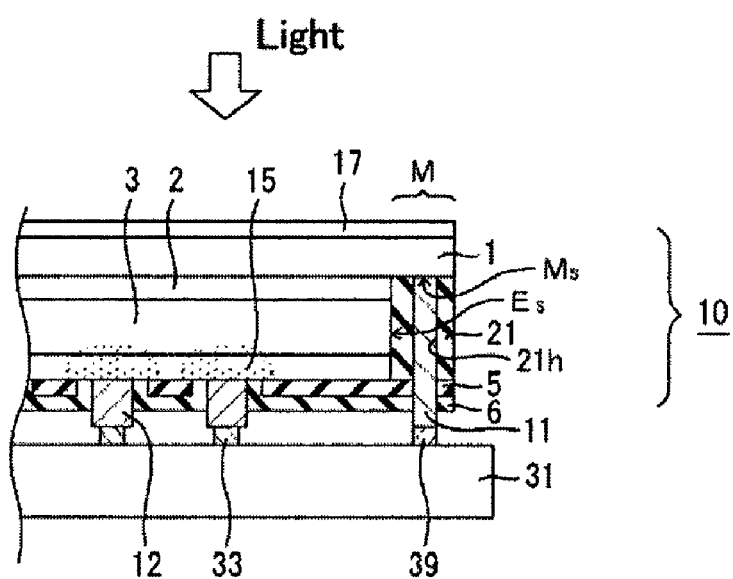
FIG. 2 is a view showing a detecting device in which the photodiode array shown in FIG. 1 is mounted on a CMOS.

FIG. 2 shows a detecting device 50 prepared by mounting the photodiode array 10 shown in FIG. 1 on a CMOS 31. In this detecting device 50, the p-side electrode 12 of each photodiode is electrically connected to a reading terminal 33 of the CMOS 31, and the common n-side electrode 11 is electrically connected to a ground terminal 39 of the CMOS 31. According to this structure, the CMOS 31 reads photogenerated charges in each photodiode, and thus, for example, a two-dimensional image can be formed or a function as a sensor of each photodiode can be achieved. The detecting device 50 shown in FIG. 2 has an epi-side-down mounting structure, that is, rear-illuminated structure. In the case of a two-dimensional array of photodiodes, crossing wirings extending from the p-side electrodes 12 of the photodiodes on the light-incident side is not preferable, and thus the rear-illuminated structure is adopted.

Figure 3:
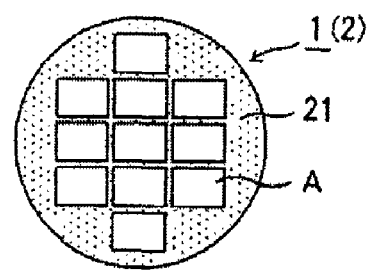
FIG. 3 is a view showing a state in which a mask for selective growth is formed on an InP substrate in manufacturing the photodiode array shown in FIG. 1.

Next, a method of manufacturing the photodiode array 10 shown in FIG. 1 will be described. FIG. 3 shows a state in which a mask pattern 21 for selective growth (i.e., selective growth mask 21) is formed on a sulfur (S)-doped n-type InP substrate 1 or InP wafer having a diameter of 2 inches. The selective growth mask 21 includes openings A and a plurality of photodiode arrays 10 are formed in the openings A. The selective growth mask 21 is formed so that the thickness H thereof is equal to the thickness of an epitaxial multilayer E. In other words, the thickness of the epitaxial multilayer E is adjusted so as to be equal to the thickness H of the selective growth mask 21. The thickness H is, for example, 7 μm. To form the selective growth mask 21, first, a resist pattern covering areas corresponding to the openings A is formed on the InP substrate 1. Subsequently, a $SiO_2$ film is formed on the InP substrate 1 by a chemical vapor deposition (CVD) method using tetraethyl orthosilicate (TEOS) as a raw material to form the selective growth mask 21 having the openings A.

Alternatively, the selective growth mask 21 may be formed by the following method. A solution prepared by dissolving silanol $(Si(OH)_2)$ in an alcohol is applied onto the InP substrate 1 by spin coating, and the InP substrate 1 is then baked to form a $SiO_2$ film. The $SiO_2$ film is formed so that the thickness thereof is equal to the thickness of the epitaxial multilayer E. Subsequently, the openings A are formed by lithography, thus forming the selective growth mask 21.

Next, the epitaxial multilayer E is formed in each of the openings A. The epitaxial multilayer E is preferably formed by an OMVPE method. Alternatively, the epitaxial multilayer E may be formed by an MBE method. The thicknesses of the layers constituting the epitaxial multilayer E are as follows. The InP buffer layer 2 has a thickness of 2 μm, the $In_{0.53}Ga_{0.47}As$ absorption layer 3 has a thickness of 4 μm, and the InP window layer 4 has a thickness of 1 μm. In this step, the crystalline array near a wall of each epitaxial layer is significantly disordered by an effect of a wall of the opening A of the selective growth mask 21. Consequently, each layer near the wall of the opening A of the selective growth mask 21 is formed not in the form of an epitaxial layer but in the form of polycrystals or the like. Epitaxial layers located at a position away from the wall are hardly affected by the wall and formed as epitaxial layers having good crystallinity. Accordingly, when the lattice defect density in the epitaxial multilayer E located near the wall is represented by $\rho_e$ and the lattice defect density in the epitaxial multilayer E located at a position away from the wall is represented by $\rho_{in}$, $\rho_e$ is very larger than $\rho_{in}$. Such a distribution of the lattice defect density is specific to the case where the epitaxial multilayer E is formed in the opening A of the selective growth mask 21. The range of the edge portion where the lattice defect density is high and epitaxial growth does not readily occur is limited to a predetermined range from the wall surface of the edge as described above.

Figure 4:
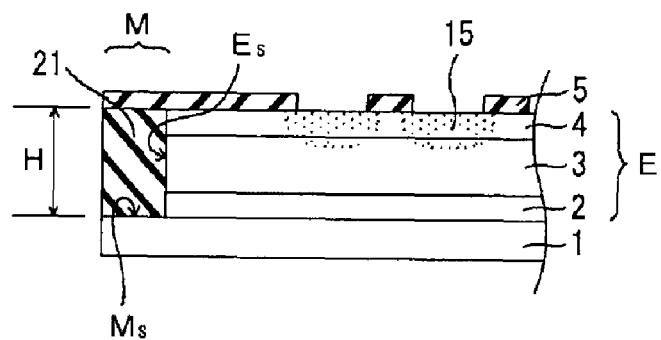
FIG. 4 is a view showing a state in which an epitaxial multilayer is formed in an opening of the mask for selective growth shown in FIG. 3, and Zn is then selectively diffused into the epitaxial multilayer using a mask for selective diffusion.

After the formation of the epitaxial multilayer E, a mask pattern 5 for selective diffusion (i.e., selective diffusion mask 5) is formed on the epitaxial multilayer E. The selective diffusion mask 5 is composed of SiN, and openings are formed in the selective diffusion mask 5 by photolithography. Zinc (Zn), which is a p-type impurity, is selectively diffused through the openings of the selective diffusion mask 5 to form a p-type region 15 for each photodiode. FIG. 4 shows a state in which selective diffusion of Zn is performed to form the p-type regions 15. Each of the p-type regions 15 has a diameter of, for example, 15 μm, and the p-type regions 15 are formed so that 320 p-type regions 15 are arrayed in the horizontal direction and 256 p-type regions 15 are arrayed in the vertical direction in a region A at intervals of 30 μm. A surface $M_s$ of the non-growth part M of the InP substrate 1 is a non-processed flat surface continuous from the inside of the InP substrate 1. In addition, a wall surface $E_s$ of an edge of the epitaxial multilayer E is a smooth, flat surface.

Figure 5:
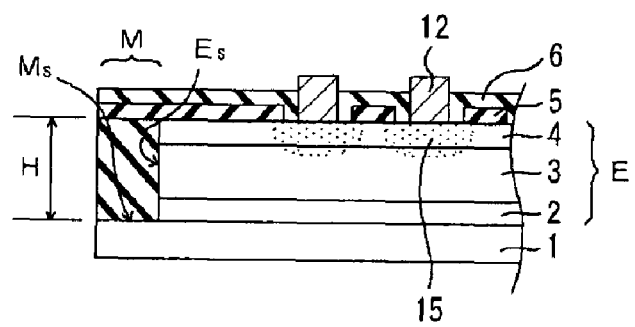
FIG. 5 is a view showing a state in which a protective film is formed on the substrate shown in FIG. 4, and a p-side electrode is then formed for each photodiode.

After the step shown in FIG. 4, a protective film 6 composed of SiON is formed and predetermined portions of the SiON protective film 6 are then opened. P-side electrodes 12 are formed in the openings. Each of the p-side electrodes 12 is composed of AuZn and formed so as to form ohmic contact with a portion of the InP window layer 4 where the p-type region 15 has been formed. FIG. 5 shows a state after the p-side electrodes 12 are formed. Subsequently, a contact hole 21h penetrating through the SiON protective film 6, the selective diffusion mask 5, and the selective growth mask 21 is formed. A common n-side electrode 11 is formed so as to fill the contact hole 21h, to extend from the contact hole 21h, and to have the same height as the height of the p-side electrodes 12. The n-side electrode 11 is preferably composed of AuGeNi and formed so as to form ohmic contact with the S-doped n-type InP substrate 1. The p-side electrode 12 is formed for each photodiode, and the n-side electrode 11 common to the photodiodes is formed, thus manufacturing the photodiode array 10. FIG. 1 shows the completed photodiode array 10.

The n-side electrode 11 described above is formed in a mask portion of the selective growth mask 21, which is located at the edge of the epitaxial multilayer E. That is, the n-side electrode 11 may have a structure in which the n-side electrode 11 fills the contact hole 21h penetrating through the mask portion and extends to the top surface side. Consequently, the n-side electrode 11 can be disposed at the same height level as that of the p-side electrodes 12. As a result, the p-side electrodes 12 and the n-side electrode 11 can be easily connected to the reading terminals 33 and the ground terminal 39, respectively, of the CMOS 31 using solder or the like. In summary, a through-hole reaching the InP substrate 1 is formed through the above mask portion 21, and the n-side electrode 11 is then formed by filling the through-hole. Accordingly, an improvement of the manufacturing efficiency and an improvement of the yield can be realized.

First Modification of First Embodiment

Figure 6:
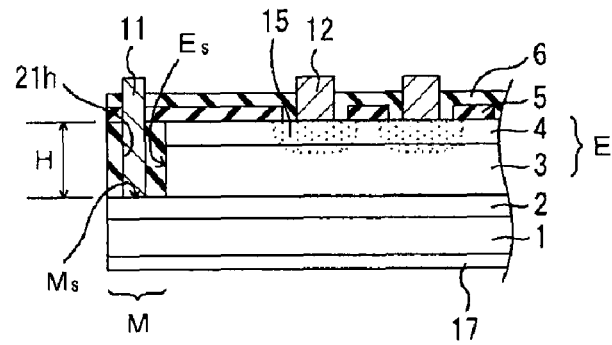
FIG. 6 shows a modification of the first embodiment of the present invention and is a view showing a state in which a contact hole is formed through a mask for selective growth disposed on a non-growth part of a buffer layer, and an n-side electrode is then formed in the contact hole.

FIG. 6 is a view showing a first modification of the photodiode array 10 shown in FIG. 1. In FIG. 6, an epitaxial multilayer E includes an absorption layer 3 and a window layer 4, but does not include a buffer layer 2. Unlike the photodiode array 10 shown in FIG. 1, the buffer layer 2 includes a non-growth part M that does not overlap the epitaxial multilayer E. That is, the buffer layer 2 is formed on an InP substrate 1 so as to entirely cover the InP substrate 1. In FIG. 3, a selective growth mask 21 is formed on the buffer layer 2. Specifically, the buffer layer 2 is formed on the InP substrate 1, and the selective growth mask 21 having openings A is formed on the buffer layer 2. The thickness of the epitaxial multilayer E not including the buffer layer 2 is adjusted to be equal to the thickness H of the selective growth mask 21.

In the first modification shown in FIG. 6, a common n-side electrode 11 is connected to the non-growth part M of the buffer layer 2. Accordingly, the InP substrate 1 may not contain an n-type impurity, for example, S, in a high concentration. Also in the structure shown in FIG. 1, the buffer layer 2 contains an n-type impurity, for example, silicon (Si), in a high concentration. This is because the n-type impurity decreases the electrical resistance of the buffer layer 2 to increase a reverse bias voltage that is effectively applied to a p-n junction. It is necessary that the buffer layer 2 of the photodiode array 10 of the first modification shown in FIG. 6 also contain an n-type impurity in a high concentration. Consequently, the common n-side electrode 11 can form ohmic contact with the buffer layer 2.

In the photodiode array 10 shown in FIG. 6, the buffer layer 2 is excluded from the epitaxial multilayer E and is added to the InP substrate 1 as a surface layer thereof. The above changes in the InP substrate 1, the buffer layer 2, and the epitaxial multilayer E do not affect other components. That is, the above changes do not affect the formation of the selective growth mask 21 and the n-side electrode 11. In the first modification, the structure and the manufacturing process of the first embodiment can be used in portions other than the InP substrate 1, the buffer layer 2, and the epitaxial multilayer E.

Second Modification of First Embodiment

The absorption layer 3 of the above-described epitaxial multilayer E is composed of $In_{0.53}Ga_{0.47}As$. Alternatively, in order to extend the responsivity to the long-wavelength side, the absorption layer 3 may be composed of GaInNAs containing nitrogen (N). In a second modification of the first embodiment of the present invention, the absorption layer 3 is composed of GaInNAs, and other structures are the same as those of the first embodiment. The content of N can be determined by secondary ion mass spectroscopy (SIMS), and may be, for example, 1.5 atomic percent. By incorporating N in an amount of 1.5 atomic percent, the absorption edge wavelength of the absorption layer determined by a photo-luminescence (PL) measurement can be made to be 2.0 μm. In the case of the absorption layer composed of $In_{0.53}Ga_{0.47}As$, which does not contain N, the absorption edge wavelength determined by the PL measurement is 1.7 μm. Furthermore, according to an X-ray diffraction image, a lattice-constant shift between InP and GaInNAs containing N in the above content can be, for example, $\Delta a/a=0.01$. The above change in the absorption layer 3 from $In_{0.53}Ga_{0.47}As$ to GaInNAs does not affect the formation of the selective growth mask 21 and the n-side electrode 11. In the second modification, the structure and the manufacturing process of the first embodiment can be used in portions other than the absorption layer 3.

Third Modification of First Embodiment

The absorption layer 3 of the epitaxial multilayer E may have a type II multi-quantum well structure (InGaAs/GaAsSb). In a third modification of the first embodiment of the present invention, the absorption layer 3 has the type II multi-quantum well structure (InGaAs/GaAsSb). Other structures are the same as those of the first embodiment. In the multi-quantum well structure, the thickness of each of InGaAs and GaAsSb is preferably in the range of 2 to 5 nm, and the number of repetitions is preferably in the range of 50 to 500 pairs. The thickness of the epitaxial multilayer E 2 is adjusted to be equal to the thickness H of the selective growth mask 21. By using the absorption layer 3 having the type II multi-quantum well structure, the wavelength determined by the PL measurement can be made to be, for example, 2.5 μm. The change in the structure of the absorption layer 3 from $In_{0.53}Ga_{0.47}As$ to the type II multi-quantum well structure (InGaAs/GaAsSb) does not affect the formation of the selective growth mask 21 and the n-side electrode 11. In the third modification, the structure and the manufacturing process of the first embodiment can be used in portions other than the absorption layer 3.

Second Embodiment

Figure 7:
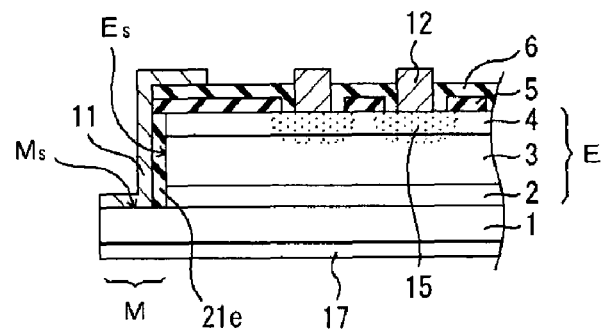
FIG. 7 is a view showing a photodiode array according to a second embodiment of the present invention.

FIG. 7 is a view showing a photodiode array 10 according to a second embodiment of the present invention. Referring to FIG. 7, an insulating film 21e is disposed between a common n-side electrode 11 and an epitaxial multilayer E. Also in this embodiment, a non-growth part M where the common n-side electrode 11 is to be formed is ensured by a selective growth mask 21. That is, etching of an edge portion of the epitaxial multilayer E for the purpose of formation of the n-side electrode 11 is not performed. Accordingly, in FIG. 7, a surface $M_s$ of the non-growth part M of an InP substrate 1 is a non-processed flat surface continuous from the inside of the InP substrate 1. In addition, a wall surface $E_s$ of the edge of the epitaxial multilayer E is a smooth, flat surface. Except for the structures of the n-side electrode 11, the insulating film 21e etc. disposed near the non-growth part M, other structures are the same as those of the photodiode array 10 shown in FIG. 1.

In manufacturing the above photodiode array 10, the step before the step shown in FIG. 7 is the same as that shown in FIG. 5 of the first embodiment. Accordingly, the photodiode array 10 shown in FIG. 7 is manufactured through the steps shown in FIGS. 3 to 5 of the first embodiment. In the state shown in FIG. 5, a resist film is formed on the protective film 6, and a portion of insulating layers located on the non-growth part M is then removed. Specifically, a portion of (protective film 6/selective diffusion mask 5/selective growth mask 21) located on the non-growth part M is etched. A HF-based etchant is used in this etching. Accordingly, the epitaxial multilayer E and the InP substrate 1 are not etched, and only the portion located on the non-growth part M is removed. That is, only the portion of the protective film 6, selective diffusion mask 5, and selective growth mask 21, the portion being located on the non-growth part M, is removed. Accordingly, the surface $M_s$ is formed as a continuous, non-processed flat surface, and the wall surface $E_s$ is formed as a smooth surface.

In this step, the edge of the epitaxial multilayer E is not exposed. Specifically, the insulating film 21e functioning as a part of the selective growth mask 21 is thinly left so as to cover the edge of the epitaxial multilayer E. The protective film 6 and the selective diffusion mask 5 are also left on the insulating film 21e so as to correspond to the position of the insulating film 21e, which in a part of the selective growth mask 21. The non-growth part M of the InP substrate 1 is exposed so as to be connected to the n-side electrode 11. The n-side electrode 11 is connected to the exposed non-growth part M of the InP substrate 1 so as to form ohmic contact. FIG. 7 shows a state where the n-side electrode 11 is formed. Instead of the above manufacturing method, the selective growth mask 21 shown in FIG. 5 may be completely removed. Subsequently, another insulating layer may be formed instead of the insulating film 21e, which is a remainder of the selective growth mask 21. The n-side electrode 11 may then be formed on the exposed on the InP substrate 1.

The n-side electrode 11 is connected to the InP substrate 1 and forms a wiring portion so as to extend along the insulating film 21e. Accordingly, the wiring portion of the n-side electrode 11 can occupy the same height as that of p-side electrodes 12. As a result, connection with terminals of a CMOS 31 can be easily established. The n-side electrode 11 can be easily formed without disconnection, and the formation of the n-side electrode 11 does not decrease the manufacturing yield.

First Modification of Second Embodiment

A buffer layer 2 may be eliminated from the epitaxial multilayer E shown in FIG. 7 and the buffer layer 2 may be included in a surface layer of the InP substrate 1. Specifically, the buffer layer 2 may be provided so as to cover the entire area of the InP substrate 1 and have the non-growth part M. In this case, the n-side electrode 11 is connected to the non-growth part M of the buffer layer 2 so as to form ohmic contact. This first modification of the second embodiment corresponds to the photodiode array 10 of the first modification of the first embodiment (see FIG. 6).

Second Modification of Second Embodiment

An absorption layer 3 of the photodiode array 10 shown in FIG. 7 is composed of $In_{0.53}Ga_{0.47}As$, which is the same as the absorption layer 3 in FIG. 1. Alternatively, in order to extend the responsivity to a long-wavelength range, the absorption layer 3 may be composed of GaInNAs instead of $In_{0.53}Ga_{0.47}As$. Alternatively, in order to obtain good crystallinity of GaInNAs, at least one of P and Sb may be added to GaInNAs. The change in the absorption layer 3 from $In_{0.53}Ga_{0.47}As$ to GaInNAs does not affect the formation of the selective growth mask 21 and the n-side electrode 11. In this second modification, the structure and the manufacturing process of the second embodiment can be used in portions other than the absorption layer 3.

Third Modification of Second Embodiment

The absorption layer 3 in FIG. 7 may have a type II multi-quantum well structure (InGaAs/GaAsSb). In a third modification of the second embodiment of the present invention, the absorption layer 3 has the type II multi-quantum well structure (InGaAs/GaAsSb). Other structures are the same as those of the photodiode array 10 shown in FIG. 7. In the multi-quantum well structure, the thickness of each of InGaAs and GaAsSb is preferably in the range of 2 to 5 nm, and the number of repetitions is preferably in the range of 50 to 500 pairs. The thickness of the epitaxial multilayer E 2 is adjusted to be equal to the thickness H of the selective growth mask 21. By using the absorption layer 3 having the type II multi-quantum well structure, the wavelength determined by a PL measurement can be made to be, for example, 2.5 g/m. The change in the absorption layer 3 from $In_{0.53}Ga_{0.47}As$ to the type II multi-quantum well structure (InGaAs/GaAsSb) does not affect other portions. That is, the change does not affect the formation of the selective growth mask 21 and the n-side electrode 11. In the third modification, the structure and the manufacturing process of the second embodiment can be used in portions other than the absorption layer 3.

Third Embodiment

Figure 8:
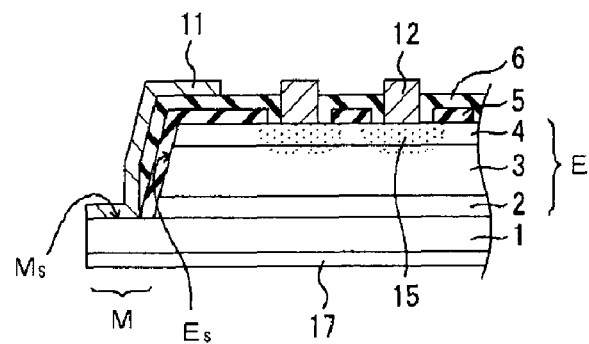
FIG. 8 is a view showing a photodiode array according to a third embodiment of the present invention.

FIG. 8 is a view showing a photodiode array 10 according to a third embodiment of the present invention. Referring to FIG. 8, a protective film 6 and a selective diffusion mask 5 are disposed between an n-side electrode 11 and an epitaxial multilayer E. Also in this embodiment, a non-growth part M where the common n-side electrode 11 is to be formed is ensured by a selective growth mask 21. That is, etching of an edge portion of the epitaxial multilayer E for the purpose of formation of the n-side electrode 11 is not performed. Accordingly, in FIG. 8, a surface $M_s$ of the non-growth part M of an InP substrate 1 is a non-processed flat surface continuous from the inside of the InP substrate 1. In addition, a wall surface $E_s$ of the edge of the epitaxial multilayer E is a smooth, flat surface. Except for the structures of part of the n-side electrode 11, the protective film 6, and the selective diffusion mask 5, the part being located near the non-growth part M, other structures are the same as those of the photodiode array 10 shown in FIG. 1. A wall of the edge of the epitaxial multilayer E of the photodiode array 10 shown in FIG. 8 is obliquely inclined, but this structure does not have a particular significance. Alternatively, as shown in FIG. 1 or 7, the wall of the edge of the epitaxial multilayer E may be orthogonal to the InP substrate 1.

Figure 9:
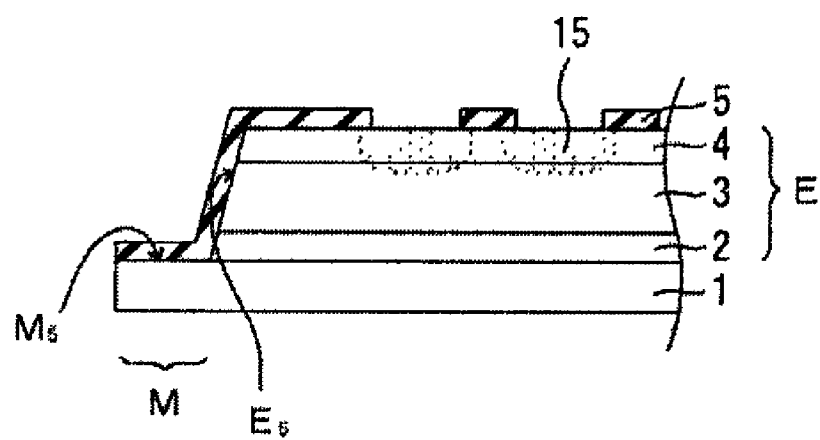
FIG. 9 is a view showing a state in which a mask for selective growth is removed, a mask for selective diffusion is then formed, and Zn is selectively diffused in manufacturing the photodiode array shown in FIG. 8.

The photodiode array 10 described above is manufactured through the step shown in FIG. 3. Specifically, an epitaxial multilayer E is formed in each opening A of a selective growth mask 21. The structures of layers constituting the epitaxial multilayer E are the same as those of the photodiode array 10 shown in FIG. 1. A thickness H of the selective growth mask 21 may be the same as, larger than, or smaller than the thickness of the epitaxial multilayer E. After the epitaxial multilayer E is formed on each of the openings A, the selective growth mask 21 is removed. After the selective growth mask 21 is removed, a selective diffusion mask 5 is formed, and Zn is selectively diffused. FIG. 9 shows a state in which Zn is selectively diffused to form p-type regions 15. The selective diffusion mask 5 extends to the non-growth part M of the InP substrate 1. Subsequently, a protective film 6 composed of SiON is formed so as to cover the selective diffusion mask 5.

Subsequently, openings are formed so that the center of each of the openings overlaps the center of the corresponding p-type region 15, and p-side electrodes 12 are formed. Furthermore, part of the selective diffusion mask 5 and protective film 6, the part being located on the non-growth part M of the InP substrate 1, is removed using a HF-based etchant. Since this etching is performed using the HF-based etchant, the surface $M_s$ is formed as a non-processed flat surface continuous from the inside. Furthermore, the wall surface $E_s$ is formed as a smooth surface without irregularities. Accordingly, the common n-side electrode 11 can be efficiently and reliably formed, and thus a decrease in the manufacturing yield does not occur.

First Modification of Third Embodiment

A buffer layer 2 may be eliminated from the epitaxial multilayer E shown in FIG. 8 and the buffer layer 2 may be included in a surface layer of the InP substrate 1. Specifically, the buffer layer 2 may be provided so as to cover the entire area of the InP substrate 1 and have the non-growth part M. In this case, the n-side electrode 11 is connected to the non-growth part M of the buffer layer 2 so as to form ohmic contact. This first modification of the third embodiment corresponds to the photodiode array 10 of the first modification of the first embodiment (see FIG. 6).

Second Modification of Third Embodiment

An absorption layer 3 of the photodiode array 10 shown in FIG. 8 is composed of $In_{0.53}Ga_{0.47}As$, which is the same as the absorption layer 3 shown in FIG. 1. Alternatively, in order to extend the responsivity to a long-wavelength range, the absorption layer 3 may be composed of GaInNAs instead of $In_{0.53}Ga_{0.47}As$. Alternatively, in order to obtain good crystallinity of GaInNAs, at least one of P and Sb may be added to GaInNAs. The change in the absorption layer 3 from $In_{0.53}Ga_{0.47}As$ to GaInNAs does not affect the formation of the selective growth mask 21 and the n-side electrode 11. In this third modification, the structure and the manufacturing process of the third embodiment can be used in portions other than the absorption layer 3.

Third Modification of Third Embodiment

The absorption layer 3 in FIG. 8 may have a type II multi-quantum well structure (InGaAs/GaAsSb). Other structures are the same as those of the photodiode array 10 shown in FIG. 8. The change in the absorption layer 3 from $In_{0.53}Ga_{0.47}As$ to the type II multi-quantum well structure (InGaAs/GaAsSb) does not affect other portions. That is, the change does not affect the formation of the selective growth mask 21 and the n-side electrode 11. In this third modification, the structure and the manufacturing process of the third embodiment can be used in portions other than the absorption layer 3.

Manufacturing Method—Comparison with Known Method—

Figure 10:
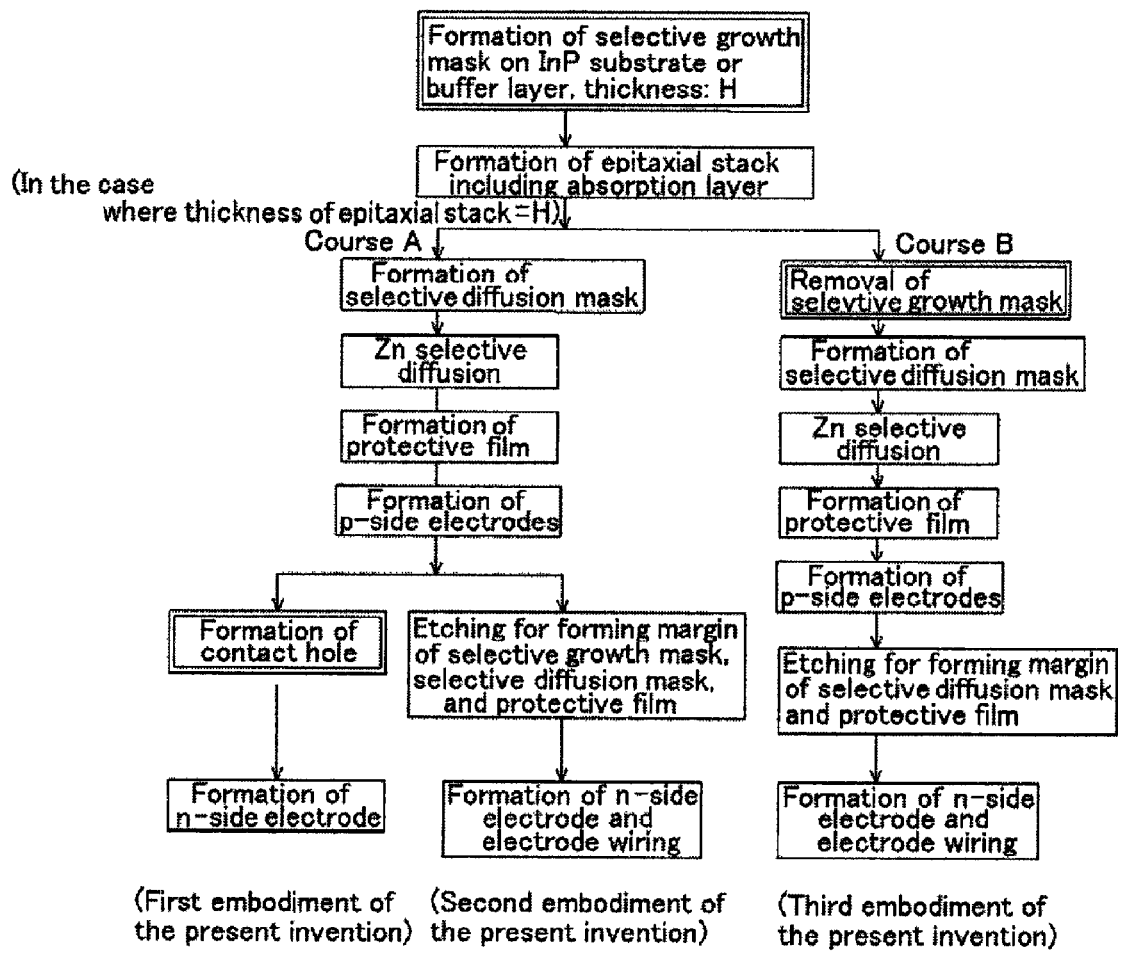
FIG. 10 is a process chart showing methods of manufacturing the photodiode array according to the first to third embodiments of the present invention.

FIG. 10 is a chart showing methods of manufacturing the photodiode arrays according to the first to third embodiments of the present invention. Common manufacturing processes lie in the following (1), (2), and (3). (1) A selective growth mask 21 is formed on an InP substrate 1 or a buffer layer 2. (2) An epitaxial multilayer E is formed in each opening A of the selective growth mask 21. (3) A non-growth part M is generated in the InP substrate 1 or buffer layer 2 covered with the selective growth mask 21. An n-side electrode 11 is connected to the non-growth part M of the InP substrate 1 or buffer layer 2.

Figure 11:
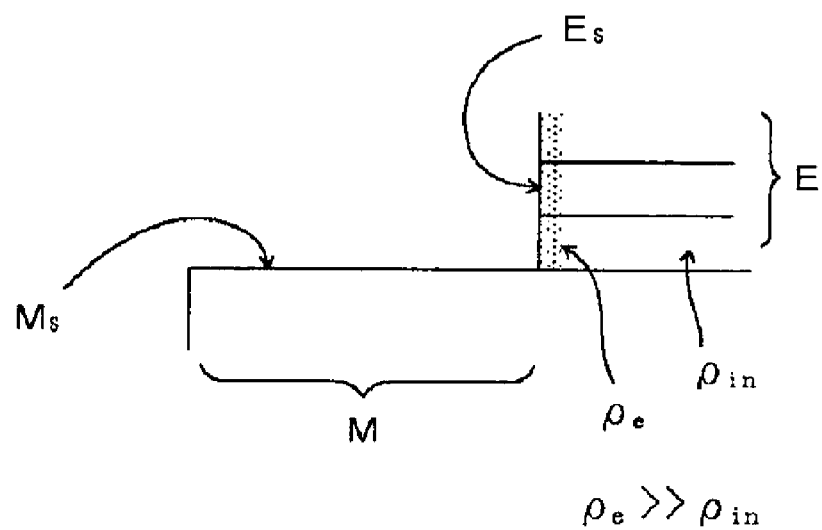
FIG. 11 is a view showing characteristics of the structure of a photodiode array of the present invention.

On the basis of the manufacturing processes described in (1) to (3) above, the following structural characteristics (K1) to (K3) are provided. FIG. 11 shows the structural characteristics (K1), (K2), and (K3).

(K1) A lattice defect density $\rho_e$ of an edge portion of the epitaxial multilayer E is significantly larger than a lattice defect density $\rho_{in}$ of the inside of the epitaxial multilayer E. In the edge portion, as each layer constituting the epitaxial multilayer E is not epitaxially grown but formed as polycrystals, the crystalline array is disordered.

(K2) A surface $M_s$ of the non-growth part M of the InP substrate 1 or the buffer layer 2 is continuous from the inside, and is a non-processed flat surface. Here, the term "inside" means an area of the InP substrate 1 or buffer layer 2, the area being covered with the epitaxial multilayer E.

(K3) A wall surface $E_s$ of the edge of the epitaxial multilayer E is a smooth, flat surface and does not have irregularities thereon. Specifically, edges of adjacent wall surfaces corresponding to the plane directions of layers constituting the epitaxial multilayer E do not form an angle at a boundary therebetween, and thus an angular shape such as a depression or a projection is not formed.

On the basis of the above characteristics in the manufacture, the following operations and advantages in practical use can be obtained.

(E1) The n-side electrode 11 can be reliably formed without disconnection. The resulting product has high reliability, and thus a high manufacturing yield can be achieved.

(E2) The manufacturing efficiency is markedly improved, as compared with a known method. A quantitative evaluation of (E1) and (E2) above will be described in Examples.

Next, a description will be made of structures, operations, and advantages other than (K1) to (K3) and (E1) and (E2) above, the structures, operations, and advantages being specific to the embodiments.

Structure, Operation, and Advantage Specific to the First Embodiment of the Present Invention (1) The thickness of an epitaxial multilayer E is made to be equal to the thickness H of a selective growth mask 21. Alternatively, the selective growth mask 21 is formed so that the thickness H of the selective growth mask 21 is equal to the thickness of the epitaxial multilayer E. This method is described in course A in FIG. 10, and corresponds to the first embodiment and the second embodiment.

(2) A contact hole 21h is formed through the selective growth mask 21 on a non-growth part M, and an n-side electrode 11 is formed in the contact hole 21h.

(3) Electrode wiring formed by extending the n-side electrode 11 so as to have the same height level as that of p-side electrodes 12 need not be formed, or the process for forming such electrode wiring can be simplified. Specifically, the height level can be ensured by forming the n-side electrode 11 by filling the contact hole 21h with a material of the n-side electrode 11 and continuously depositing the material so as to project from the contact hole 21h.

(4) The selective growth mask 21 is used to protect or insulate the n-side electrode 11. Therefore, the selective growth mask 21 need not be removed, and thus the man-hours can be more significantly reduced.

Structure, Operation, and Advantage Specific to the Second Embodiment of the Present Invention (1) As in the first embodiment, the thickness of an epitaxial multilayer E is made to be equal to the thickness H of a selective growth mask 21 (course A in FIG. 10).

(2) A part of the selective growth mask 21, the part being located outside the non-growth part M, is removed, and an n-side electrode 11 is then formed. Alternatively, the selective growth mask 21 on the non-growth part M may be entirely removed, and another insulating film may then be formed for the n-side electrode 11.

(3) It is necessary to form electrode wiring by extending the n-side electrode 11 so as to have the same height level as that of p-side electrodes 12.

(4) In the case where a part of the selective growth mask 21 is left, the man-hours can be further reduced.

Structure, Operation, and Advantage Specific to the Third Embodiment of the Present Invention (1) The thickness of the epitaxial multilayer E may be the same as or different from the thickness H of the selective growth mask 21. Before a selective diffusion mask 5 is formed, the selective growth mask 21 is completely removed (course B in FIG. 10).

(2) A wall surface $E_s$ of an edge of the epitaxial multilayer E is covered with the selective diffusion mask 5 and/or a protective film 6.

(3) It is necessary to form electrode wiring by extending the n-side electrode 11 so as to have the same height level as that of p-side electrodes 12.

(4) It is necessary to completely remove the selective growth mask 21 and to remove the selective diffusion mask 5 etc. located on the non-growth part M.

Figure 12:
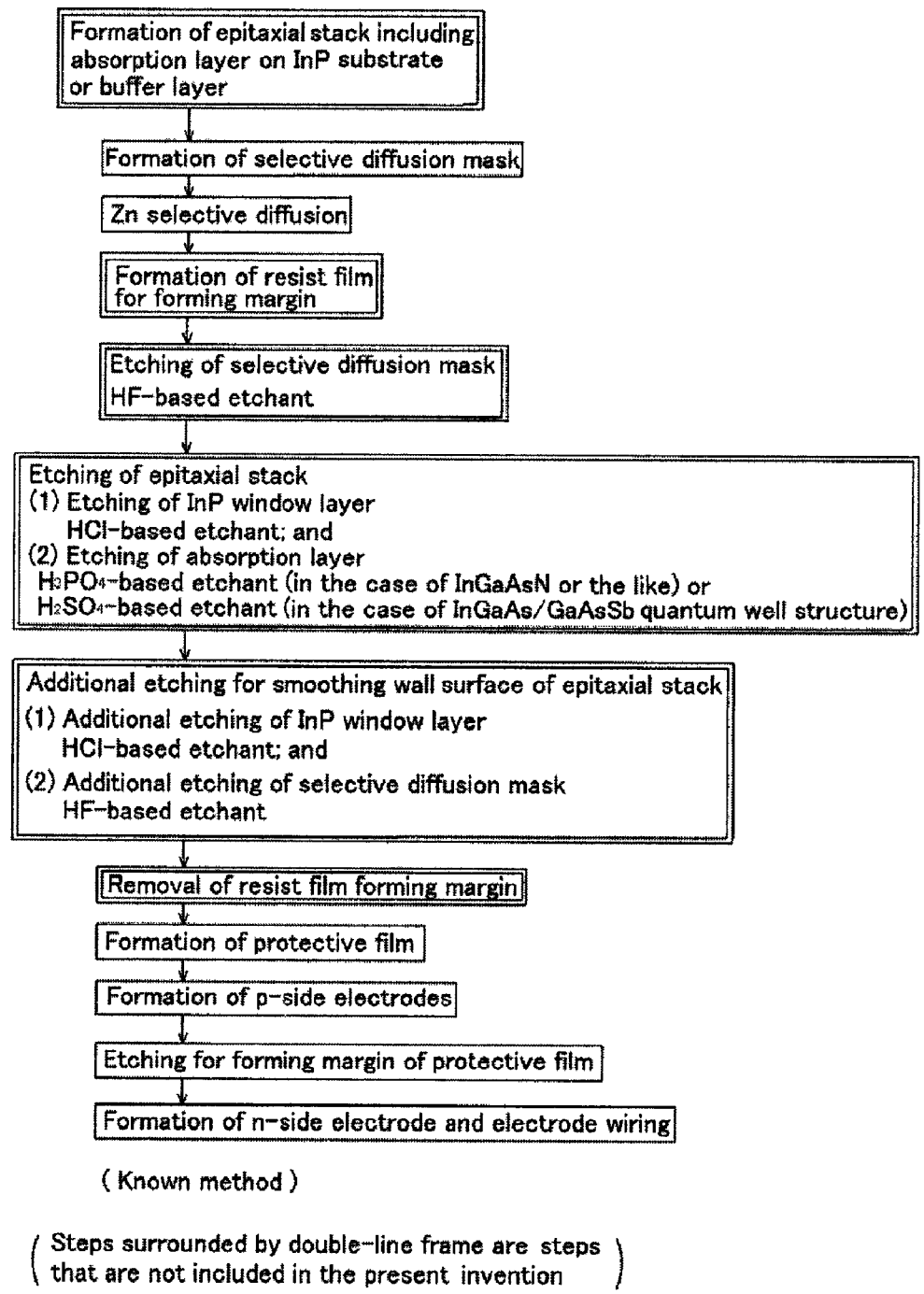
FIG. 12 is a process chart showing a known method.
Figure 13:
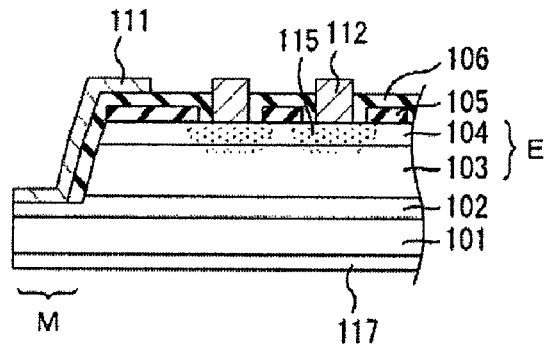
FIG. 13 is a view showing a known photodiode array (in the case where an absorption layer is composed of InGaAs).
Figure 16:
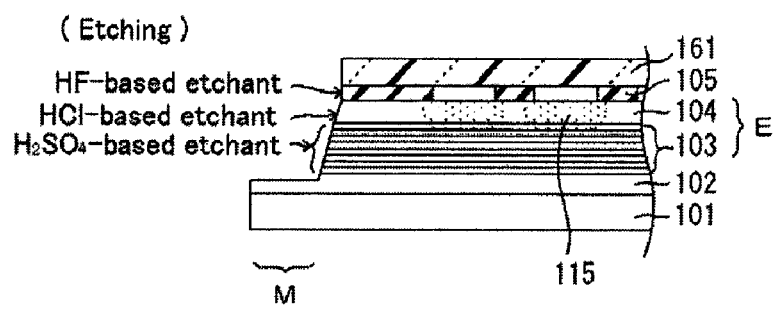
FIG. 16 is a view showing a state in which an edge portion of an epitaxial multilayer is etched in order to form a non-growth part in manufacturing another known photodiode array (in the case where an absorption layer has a type II multi-quantum well structure).

FIG. 12 is a chart showing a known method of manufacturing a photodiode array. In the known method, etching of an epitaxial multilayer E is performed in order to form a non-growth part M on which an n-side electrode 11 is to be disposed. For a description of the known method, specific photodiode arrays 110 shown in FIGS. 13 and 16 will be referred. FIG. 13 shows a photodiode array 110 in which $In_{0.53}Ga_{0.47}As$ is used as an absorption layer 103. FIG. 16 shows a photodiode array 110 in which a type II multi-quantum well structure (InGaAs/GaAsSb) is used as an absorption layer 103. Both the photodiode arrays 110 are manufactured in accordance with the process shown in FIG. 12. First, a method of manufacturing the known photodiode array 110 shown in FIG. 13 will be described.

Figure 14:
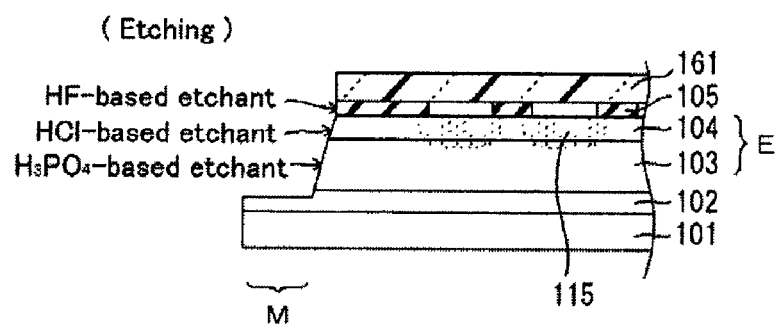
FIG. 14 is a view showing a state in which an edge portion of an epitaxial multilayer is etched in order to form a non-growth part in manufacturing the photodiode array shown in FIG. 13.

In the known method, an epitaxial multilayer E is formed over the entire surface of an InP substrate 101 or a buffer layer 102. Subsequently, a mask pattern 105 for selective diffusion (i.e., selective diffusion mask 105) is formed, and Zn, which is a p-type impurity, is selectively diffused. A p-type region 115 is formed for each photodiode by this selective diffusion of Zn. Subsequently, as shown in FIG. 14, a resist film 161 for forming a non-growth part is formed on the selective diffusion mask 105. Subsequently, portions that are not covered with the resist film are removed by etching. In this step, the etching is performed from the selective diffusion mask 105 by sequentially using the following etchants in accordance with the material constituting each layer.

Figure 15:
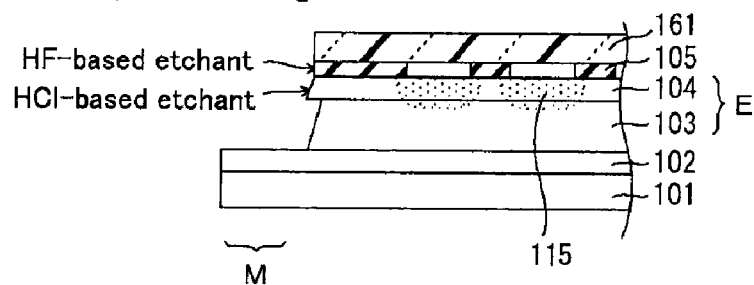
FIG. 15 is a view showing a state before an additional etching is performed in order to further smooth a wall of the edge portion of the epitaxial multilayer shown in FIG. 14.

(Selective diffusion mask 105): HF-based etchant
(InP window layer 104): HCl-based etchant
($In_{0.53}Ga_{0.47}As$ absorption layer 103): $H_3PO_4$-based etchant Here, when a wall surface $E_s$ of the epitaxial multilayer E etc. is exaggeratingly shown, large irregularities shown in FIG. 15 become apparent. These irregularities represent plane directions due to the etching of epitaxial layers. If n-side electrode wiring is formed on such an irregular wall surface, disconnection occurs in portions located on the undersides of the irregularities. Accordingly, an additional etching is performed so that at least such portions located on the undersides of the irregularities are eliminated. The additional etching is performed for the selective diffusion mask 105 and the InP window layer 104. As in the first etching, the selective diffusion mask 105 is etched using a HF-based etchant. Similarly, the InP window layer 104 is etched using a HCl-based etchant. As a result, a wall surface $E_s$ shown in FIG. 13, which does not have large irregularities thereon, is formed, and the wall surface $E_s$ can be covered with a protective film 106. However, it is difficult to obtain a smooth, flat surface over the entire wall surface. An n-side electrode 111 is then formed on the protective film 106.

The first etching is performed while sequentially changing three types of etchants used. The additional etching is sequentially performed using two types of etchants. After these etching steps, the resist film 161 for forming a non-growth part is removed, and the surface is then covered with the protective film 106. The next step is the same as the step of forming the n-side electrode in the third embodiment of the present invention shown in FIG. 10.

Figure 17:
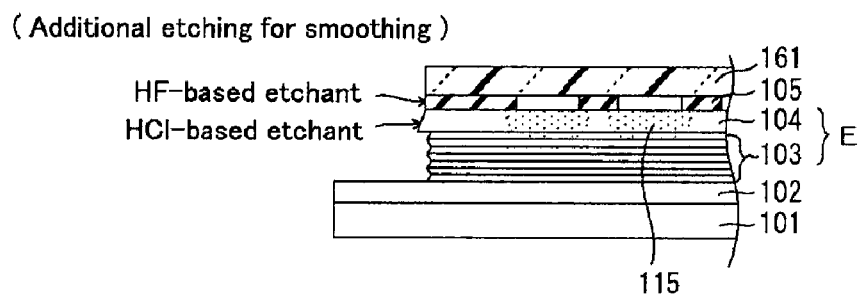
FIG. 17 is a view showing a state before an additional etching is performed in order to further smooth a wall of the edge portion of the epitaxial multilayer shown in FIG. 16.

A method of manufacturing the photodiode array 110 including the absorption layer 103 having a multi-quantum well structure shown in FIG. 16 is the same as the manufacturing method described above. However, the method of manufacturing the photodiode array 110 shown in FIG. 16 differs from the above-described method in that a $H_2SO_4$-based etchant is used for etching the absorption layer 103. In the first etching, three types of etchants, which includes the $H_2SO_4$-based etchant for etching the absorption layer 103, are sequentially used. Furthermore, as shown in FIG. 17, two types of etchants are used in the additional etching for smoothing.

The manufacturing processes according to the embodiments of the present invention shown in FIG. 10 will be compared with the known manufacturing process shown in FIG. 12. The most significant difference is that etching steps in the known process account for a large portion of the process. In the known method, five types of etching steps are performed for etching an edge portion of the epitaxial multilayer E. The layer of an etching target sequentially changes as the etching proceeds, and it is necessary to change the etchant for each etching step. Accordingly, the above etching steps require a large number of essential steps, and thus become a cause of a decrease in the manufacturing efficiency of the photodiode array 110. In contrast, the manufacturing processes shown in FIG. 10 do not include a step of etching the edge portion of the epitaxial multilayer E. The non-growth part M is ensured by the InP substrate 1 or the buffer layer 2 that is in contact with the selective growth mask 21. A HF-based etchant can etch the selective growth mask 21 and does not etch Group III-V compound semiconductors. Accordingly, the n-side electrode 11 can be formed using the selective growth mask 21 as an insulator. Alternatively, even when the selective growth mask 21 is not used as insulator, the non-growth part M is easily exposed and the n-side electrode 11 can be connected to the non-growth part M.

Figure 18:
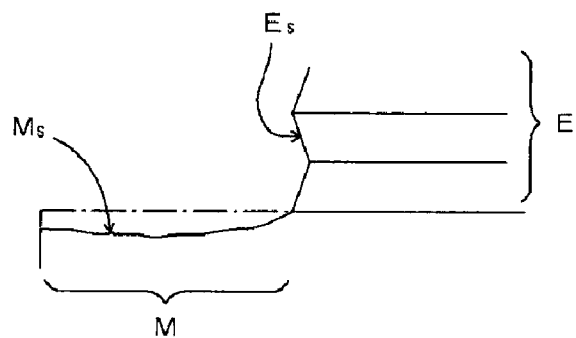
FIG. 18 is a schematic view showing characteristics of the structure of a known photodiode array.

FIG. 18 shows characteristics of the structure of the known photodiode array 110. A surface M, of the non-growth part M has a concave shape because of the etching of the epitaxial multilayer E. In addition, surfaces formed by etching of each layer appear on a wall surface $E_s$ of the epitaxial multilayer E. Consequently, edges of adjacent layers at a boundary therebetween form an angle, and thus the resulting wall surface has an angular shape. These characteristics become more apparent when compared with the characteristics of the structure of the present invention shown in FIG. 11.

EXAMPLES

1. Samples

Photodiode array samples, namely, Examples $A_1$ and $A_2$ of the present invention, and Comparative Examples $B_1$ and $B_2$ were manufactured. The photodiode array samples had the following structures:

Examples $A_1$ of the Present Invention

Photodiode array shown in FIG. 1 (Absorption layer 3: $In_{0.53}Ga_{0.47}As$, An n-side electrode 11 was formed in a contact hole 21h provided through a selective growth mask 21.)

Examples $A_2$ of the Present Invention

Photodiode array shown in FIG. 7 (Absorption layer 3: Type II multi-quantum well structure (InGaAs/GaAsSb), An n-side electrode 11 was formed in a non-growth part M formed by partly removing a selective growth mask 21.)

Comparative Example $B_1$

Photodiode array 110 shown in FIG. 13 (Absorption layer 3: $In_{0.53}Ga_{0.47}As$)

Comparative Example B$_2$

Photodiode array 110 shown in FIG. 16 (Absorption layer 3: Type II multi-quantum well structure (InGaAs/GaAsSb)).

2. Evaluation

Photodiode arrays each having a photodiode (pixel) array of 320×256 were manufactured using a 2-inch InP substrate. Eleven photodiode arrays were manufactured per 2-inch InP substrate. The manufacturing man-hours per 2-inch InP substrate were measured.

3. Results

In the above manufacture, the time required for manufacturing Examples A$_1$ and A$_2$ of the present invention could be reduced by 16 hours on average per 2-inch InP substrate as compared with Comparative Examples B$_1$ and B$_2$. This reduction in manufacturing time could be achieved because steps of mesa-etching performed in manufacturing Comparative Examples B$_1$ and B$_2$ were omitted in manufacturing Examples A$_1$ and A$_2$ of the present invention. The above reduction of 16 hours on average per 2-inch InP substrate is marked and has significance in, for example, inventory control in mass production. In Examples described above, an evaluation of the quality was omitted because it is difficult to quantify the quality. However, in mass production, facilitation and simplification of a process result in an improvement in quality without exception. It is obvious that this principle also applies to the product according to the present invention.

Embodiments and Examples of the present invention have been described above. However, the embodiments and the examples of the present invention disclosed above are only illustrative, and the scope of the present invention is not limited to the specific embodiments of the invention. It is to be understood that the scope of the present invention is defined in the appended claims and includes equivalence of the description of the claims and all changes within the scope of the claims.

What is claimed is:

1. A photodiode array including a plurality of photodiodes that are arrayed in an epitaxial multilayer including an absorption layer composed of a Group III-V compound semiconductor, the epitaxial multilayer being grown on an InP substrate or a buffer layer disposed on the InP substrate, the photodiode array comprising:
   a first conductivity type region formed in each of the photodiodes by selective diffusion from the top surface side of the epitaxial multilayer;
   a first conductive-side electrode provided on the first conductivity type region; and
   a second conductive-side electrode provided for the plurality of photodiodes in common,
   wherein the InP substrate or the buffer layer has a non-growth part on which the epitaxial multilayer is not grown, the non-growth part being disposed at the periphery of the photodiode array,
   the second conductive-side electrode is connected to the non-growth part of the InP substrate or the buffer layer and extends to the top surface side of the epitaxial multilayer,
   a wall surface of an edge of the epitaxial multilayer at the second conductive-side electrode side is a smooth surface,
   a lattice defect density in a portion of the edge of the epitaxial multilayer is higher than a lattice defect density in the inside of the epitaxial multilayer, and
   a surface of the non-growth part of the InP substrate or the buffer layer is a flat surface continuous from the side at which the epitaxial multilayer is disposed.

2. The photodiode array according to claim 1, wherein the second conductive-side electrode fills a contact hole penetrating through an insulating layer disposed in contact with the wall surface of the edge of the epitaxial multilayer and functioning as a selective growth mask pattern, and extends to the top surface side of the epitaxial multilayer.

3. The photodiode array according to claim 1, wherein the second conductive-side electrode extends to the top surface side of the epitaxial multilayer so as to sandwich an insulating film between the wall surface of the edge of the epitaxial multilayer and the second conductive-side electrode.

4. The photodiode array according to claim 1, wherein the absorption layer has a multi-quantum well structure.

5. The photodiode array according to claim 2, wherein the absorption layer has a multi-quantum well structure.

6. The photodiode array according to claim 3, wherein the absorption layer has a multi-quantum well structure.

7. A detecting device comprising:
   the photodiode array according to claim 1; and
   a complementary metal-oxide semiconductor (CMOS),
   wherein the first conductive-side electrode of the photodiode array is connected to a reading terminal of the CMOS, and the second conductive-side electrode of the photodiode array is connected to a ground terminal of the CMOS.

* * * * *